United States Patent
Yoshida et al.

[11] Patent Number: 6,132,938
[45] Date of Patent: Oct. 17, 2000

[54] PROCESS FOR MAKING LITHOGRAPHIC PRINTING PLATE

[75] Inventors: Akio Yoshida; Jun Yamada; Takenobu Yoshiki; Takao Arai; Kazuhiko Ibaraki, all of Tokyo, Japan

[73] Assignee: Mitsubishi Paper Mills Limited, Tokyo, Japan

[21] Appl. No.: 09/184,023

[22] Filed: Nov. 2, 1998

[30]   Foreign Application Priority Data

| Nov. 6, 1997 | [JP] | Japan | 9-304390 |
| Nov. 6, 1997 | [JP] | Japan | 9-304391 |
| Nov. 6, 1997 | [JP] | Japan | 9-304392 |
| Nov. 6, 1997 | [JP] | Japan | 9-304393 |
| Nov. 6, 1997 | [JP] | Japan | 9-304394 |
| Jan. 26, 1998 | [JP] | Japan | 10-12642 |
| Feb. 3, 1998 | [JP] | Japan | 10-21653 |

[51] Int. Cl.$^7$ .............................. G03F 7/07; G03F 7/004; G03F 7/20; G03C 1/494
[52] U.S. Cl. ........................ 430/302; 430/204; 430/278.1; 430/616; 430/964; 101/459
[58] Field of Search .................... 430/616, 964, 430/204, 278.1, 302; 101/459

[56]   References Cited

U.S. PATENT DOCUMENTS

| 5,273,858 | 12/1993 | Coppens et al. | 430/204 |
| 5,401,611 | 3/1995 | Edwards et al. | 430/616 |
| 5,427,889 | 6/1995 | Saikawa et al. | 430/204 |
| 5,436,110 | 7/1995 | Coppens et al. | 430/204 |
| 5,731,124 | 3/1998 | Jonckheere et al. | 430/204 |
| 5,916,734 | 6/1999 | Takagami et al. | 430/204 |

*Primary Examiner*—Richard L. Schilling
*Attorney, Agent, or Firm*—Pillsbury Madison & Sutro LLP

[57]   ABSTRACT

There is disclosed a process for making a lithographic printing plate which comprises subjecting a lithographic printing plate precursor having a silver thin film on a grained and anodized aluminum base to exposure by a heat-mode laser beam whereby removing the silver thin film, wherein the aluminum base has a surface activity which can form physical development silver in an amount of 0.5 g/m$^2$ or more when the base is processed by using the following Physical development solution 1 at 23° C. for 30 minutes:

Physical development solution 1 wherein 1 part by volume of Solution B is added to 5 parts by volume of Solution A;

| Solution A: | Anhydrous sodium sulfite | 180 g |
| | 10% Silver nitrate solution | 75 ml |
| | Make up to 1000 ml with addition of water, | |
| Solution B: | Anhydrous sodium sulfite | 20 g |
| | Hydroquinone | 20 g |
| | Make up to 1000 ml with addition of water. | |

34 Claims, 1 Drawing Sheet

( a )

(a)

PROCESS FOR MAKING LITHOGRAPHIC PRINTING PLATE

BACKGROUND OF THE INVENTION

This invention relates to a process for making a lithographic printing plate, more specifically to a process for making a lithographic printing plate which can be handled under a room light, can image with a laser under heat-mode, requires no processing solution and gives high resolution.

A lithographic printing plate comprises an oleophilic image area which accepts oily ink, and an oil-repellent non-image area which does not accept ink. The non-image area generally comprises a hydrophilic portion which accepts water. In a usual lithographic printing plate, printing is carried out by supplying both of water and an ink to a plate surface whereby the image area selectively accepts the ink and the non-image area selectively accepts water, and transferring the ink on the image area to a material to be printed such as paper, or the like.

A lithographic printing plate has now been prepared by forming an oleophilic ink receptive layer on a substrate such as an aluminum plate, a zinc plate, paper or the like, the surface of which are subjected to hydrophilic treatment. Among these, it is general to use those in which a photosensitive material such as a diazo compound or a photopolymer, etc. is provided on an aluminum base the surface of which is subjected to hydrophilic treatment which is so-called a presensitized (PS) plate, or those in which an image is formed by utilizing a silver complex diffusion transfer process (the DTR method) using a silver halide on paper or a plastic support as a photosensitive material.

A method for forming an ink receptive layer (hereinafter referred to as "an image layer") by a diazo compound or a photopolymer comprises firstly coating a photosensitive material such as a diazo compound, a photopolymer or the like on a substrate such as a metal plate, paper, a laminated plate, an insulating substrate, or the like. Then, light is exposed to the photosensitive material to cause chemical change whereby dissolution properties to a developing solution are changed. Here, the photosensitive material can be divided into two kinds depending on the kind of the chemical change. That is, one is a negative type in which the portion to which light is exposed is polymerized and cured to become insoluble to a developing solution, and the others is a positive type in which a functional group at the portion to which light is exposed is changed to have solubility in a developing solution. In either of the case, the photosensitive material insoluble in a developing solution, which remains on the substrate after processing with a developing solution, becomes an image layer.

On the other hand, a lithographic printing plate using the DTR method, particularly a lithographic printing plate having a physical development nuclei layer on a silver halide emulsion layer is described in, for example, U.S. Pat. Nos. 3,728,114, 4,134,769, 4,160,670, 4,336,321, 4,501,811, 4,510,228 and 4,621,041. Exposed silver halide microcrystals cause chemical development by the DTR developer and change to black silver to form a hydrophilic non-image area. On the other hand, unexposed silver halide microcrystals become silver complex by a complexing agent in a developing solution to diffuse to a physical development nuclei layer at the surface thereof and cause physical development in the presence of a nucleus whereby an image area mainly comprising ink receptive physically developed silver is formed.

Also, a lithographic printing plate in which a physical development nuclei layer and a silver halide emulsion layer are coated in this order on a grained and anodized aluminum support is disclosed in, for example, Japanese Provisional Patent Publications No. 260491/1988, No. 116151/1991, No. 282295/1992 or the like. The above-mentioned lithographic printing plate is imagewisely exposed, followed by DTR development, the silver halide emulsion layer is washed with warm water to form an image area mainly comprising the physically developed silver on the anodized aluminum base.

When an image layer is formed by using the above-mentioned photosensitive material, an exposure method is one of the important factors to determine resolution of an image. In the past, it was a main stream to prepare a finishing film and then to use close contact exposure system with an ultraviolet ray or a white light. However, accompanying with the progress of computer technology, it has been employed a laser direct imaging system in which digital signal from computer information is transferred to an exposure device (computer to plate) and a photosensitive material is directly exposed by using a laser. The laser direct imaging system has advantages of low cost, time-saving, high productivity in many kinds of products with a small size or the like since films to be used in the course of the processing can be omitted.

In order to be applied with the laser direct imaging system, a sensitivity of the photosensitive material must be made high. In a diazo compound or a photopolymer, their sensitivities are low as several to several hundreds $mJ/cm^2$ since a photochemical reaction occurs. Thus, a laser output apparatus is required to be high power output whereby there are problems that the apparatus becomes large or a cost becomes expensive. Also, when an image is formed by the DTR method using a silver halide, its sensitivity is several $\mu J/cm^2$ so that exposure can be carried out sufficiently with a simple and easy semiconductor laser or the like. However, there is a defect that efficiency and plate-making operations become markedly poor since storage, coating to a substrate or the like before subjecting to exposure must be carried out under a safety light. Further, in the case of the diazo compound or the photopolymer, the reaction proceeds by a room light or sunlight and their reactivities change at a high temperature. Moreover, when an oxygen is present, it becomes an inhibitor of the reaction. Thus, it is necessary to treat under a dark room or store at a low oxygen condition until exposure and development are carried out.

Furthermore, in the above image formation methods, it is general to carry out processing with a liquid using a developing solution so that there is a defect that treatment of the waste solution becomes environmental issue. From 1995, a waste liquid is prohibited to throw into the ocean and processing with a dried state is earnestly desired today.

SUMMARY OF THE INVENTION

An object of the present invention is to provide a process for making a lithographic printing plate which can handle under a room light, is suitable for a direct imaging method by a laser beam, can provide an image with high resolution and generates no waste liquid by the plate-making method of a lithographic printing material.

The present inventors have intensively studied to overcome the above-mentioned problems, and as a result, they have found the following invention.

The process for making a lithographic printing plate of the present invention comprises subjecting a lithographic printing plate precursor having a silver thin film on a grained and anodized aluminum base to exposure by a heat-mode laser beam whereby removing said silver thin film, wherein said aluminum base has a surface activity which can form physical development silver in an amount of 0.5 g/m² or more when the base is processed by using the following Physical development solution 1 at 23° C. for 30 minutes.

Here, the physical development solution 1 has the following composition.

Physical development solution 1 (1 part by volume of Solution B is added to 5 parts by volume of Solution A)

| Solution A: | Anhydrous sodium sulfite | 180 g |
| --- | --- | --- |
| | Silver nitrate (10% solution) | 75 ml |
| | Make up to 1000 ml with addition of water. | |
| Solution B: | Anhydrous sodium sulfite | 20 g |
| | Hydroquinone | 20 g |
| | Make up to 1000 ml with addition of water. | |

DESCRIPTION OF THE PREFERRED EMBODIMENTS

Figure 1:
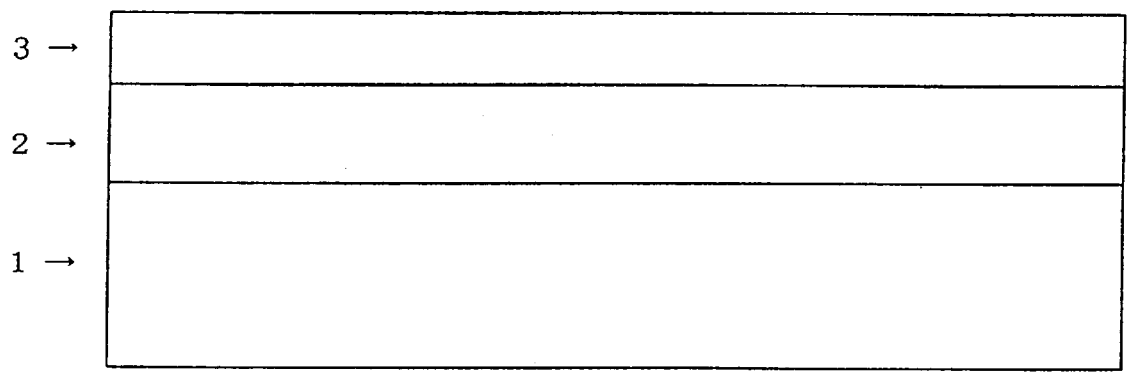
FIG. 1 is a schematic drawing showing a lithographic printing material of the present invention.

Among the present invention, in the process for making a lithographic printing plate which is the second invention, an aluminum base which is subjected to graining treatment, followed by treatment with an acidic solution, then subjected to anodizing treatment is used. Thus aluminum base has a surface activity which can form a preferred physical development silver, and by using the same, an adhesive force between a silver thin film and the aluminum base become firm whereby runlength of the lithographic printing plate is improved.

Among the present invention, the process for making a lithographic printing plate, which is the third invention, comprises using an aluminum base which is subjected to graining treatment, followed by treatment with an acidic solution containing a nitric acid, then subjected to anodizing treatment. This aluminum base has a surface activity which can form preferred physical development silver, and by using the same, an adhesive force between a silver thin film and the aluminum base become firm whereby runlength of the lithographic printing plate is improved.

Among the present invention, the process for making a lithographic printing plate, which is the third invention, comprises using an aluminum base which is subjected to graining treatment, followed by treatment with an acidic solution containing a nitric acid, then subjected to anodizing treatment. This aluminum base has a surface activity which can form more preferred physical development silver, and by using the same, an adhesive force between a silver thin film and the aluminum base become more firm whereby runlength of the lithographic printing plate is improved.

Among the present invention, in the process for making a lithographic printing plate, which is the fourth invention, the silver thin film of the lithographic printing material comprises physical development silver formed by the silver complex diffusion transfer process. The silver thin film which is physically developed by the silver complex diffusion transfer process has a higher laser absorption ratio and oleophilicity and has a higher ink receptivity as compared with those formed by the deposition method or the like whereby its characteristics as a printing plate are improved.

Also, a silver thin film in which granular silver particles are deposited is formed so that it is likely subjected to ablation.

Among the present invention, the process for making a lithographic printing plate which is the fifth invention, comprises, after providing a physical development nuclei layer on said aluminum base, forming a silver thin film of said lithographic printing material by using the silver complex diffusion transfer process. According to this process, the silver thin film can be easily formed on the surface of the anodized aluminum base, and an adhesive force between the silver thin film and the aluminum base is firm whereby runlength of the lithographic printing plate can be improved. Also, when an amount of the physical development nuclei or the like is changed, a size of the formed silver particles can be changed, and thus, a silver thin film suitable for ablation can be formed.

Among the present invention, the process for making a lithographic printing plate, which is the sixth invention, comprises a thickness of the anodized film of said aluminum base being 0.6 $\mu$m or more, and the silver thin film of a lithographic printing plate precursor being composed of a physical development silver which is formed by the silver complex diffusion transfer process. By using an aluminum base having an anodized film with a thickness within the above range, the silver thin film comprising physical development silver formed by the silver complex diffusion transfer process has excellent laser imaging suitability and a long runlength.

Among the present invention, the process for making a lithographic printing plate, which is the seventh invention, comprises a ratio of an anodized amount AW to the center line surface roughness Ra of said aluminum base (AW/Ra) being 5 or more, and the silver thin film of a lithographic printing plate precursor being composed of physical development silver formed by the silver complex diffusion transfer process. By using an aluminum base having an anodized film of AW/Ra$\geq$5, the silver thin film comprising physical development silver formed by the silver complex diffusion transfer process has excellent laser imaging suitability and a long runlength.

Among the present invention, in the process for making a lithographic printing plate, which is the eighth invention, an aluminum base having a thickness of the anodized film of 0.6 $\mu$m or more which is the sixth invention is used, or an aluminum base having a ratio of an anodized amount AW to the center line surface roughness Ra thereof (AW/Ra) of 5 or more which is the seventh invention is used, and the silver thin film of a lithographic printing plate precursor comprises physical development silver formed by the silver complex diffusion transfer process and after forming a physical development nuclei layer on said aluminum base, the silver thin film of said lithographic printing material is formed by the silver complex diffusion transfer process. According to this constitution, more excellent laser imaging suitability and a long runlength are to be obtained.

Among the present invention, the process for making a lithographic printing plate, which is the ninth invention, comprises, in a process for making a lithographic printing plate which comprises subjecting a lithographic printing plate precursor having a silver thin film provided on a grained and anodized aluminum base to laser beam exposure to remove said silver thin film whereby forming a lithographic printing plate, physical development nuclei being formed by coating a solution containing a silver ion on said aluminum base, and then, subjecting to silver complex diffusion transfer development to provide a silver thin film.

According to this method, by utilizing surface activity of the aluminum base, physical development nuclei are to be formed by coating a solution containing silver ions. This method has merits that batch-to-batch variation of the conventional nucleus formation process can be prevented and a cost can be decreased. And yet, it is found that the silver thin film formed on the aluminum base to which physical development nuclei are thus provided has excellent laser image-exposure suitability and printability.

Among the present invention, the process for making a lithographic printing plate, which is the tenth invention, comprises, in a process for making a lithographic printing plate which comprises subjecting a lithographic printing plate precursor having a silver thin film provided on a grained and anodized aluminum base to laser beam exposure to remove said silver thin film whereby forming a lithographic printing plate, treating said aluminum base with a metal salt solution of zinc or a metal noble in a standard electrode potential than zinc.

Among the present invention, the process for making a lithographic printing plate, which is the eleventh invention, comprises using, as the aluminum base, an aluminum base subjected to a metal salt treatment after desmutting treatment and before the anodizing treatment. This aluminum base has a surface activity which can form preferred physical development silver, and by using the same, an adhesive force between a silver thin film and the aluminum base become firm whereby runlength of the lithographic printing plate is improved.

Among the present invention, in the process for making a lithographic printing plate, which is the twelfth invention, the silver thin film provided on the aluminum base treated by a metal salt solution of zinc or a metal noble in a standard electrode potential than zinc comprises physical development silver formed by the silver complex diffusion transfer process. The silver thin film prepared by the above process has a higher laser absorption ratio and oleophilicity and has a higher ink receptivity as compared with those formed by the deposition method or the like whereby its characteristics as a lithographic printing plate are improved.

Among the present invention, the process for making a lithographic printing plate, which is the thirteenth invention, comprises a process for making a lithographic printing plate which comprises subjecting a lithographic printing plate precursor in which a silver thin film is formed on an aluminum base, said base had been subjected to anodizing treatment of a grained aluminum base and then to a pore filling treatment, to exposure by a heat-mode laser beam whereby removing said silver thin film. A lithographic printing plate excellent in laser exposure suitability and a printability can be obtained.

Among the present invention, the process for making a lithographic printing plate, which is the fourteenth invention, comprises a silver thin film formed on an aluminum base which had been subjected to the pore filling treatment, and the film comprises physical development silver formed by the silver complex diffusion transfer process. The silver thin film formed by the process has a higher laser absorption ratio and oleophilicity and has a higher ink receptivity as compared with those formed by the deposition method or the like whereby its characteristics as a lithographic printing plate are improved.

Among the present invention, the process for making a lithographic printing plate, which is the fifteenth invention, comprises, in a process for making a lithographic printing plate which comprises subjecting a lithographic printing plate precursor in which a silver thin film is formed on a support to exposure by a heat-mode laser beam whereby removing said silver thin film, forming said silver thin film in the presence of an amine compound.

Among the present invention, the process for making a lithographic printing plate which is the sixteenth invention, comprises, in a process for making a lithographic printing plate precursor which comprises subjecting a lithographic printing plate in which a silver thin film is formed on a support to exposure by a heat-mode laser beam whereby removing said silver thin film, forming a silver film which is composed of granular silver particles having an average particle size of 0.005 to 0.2 μm.

Among the present invention, the process for making a lithographic printing plate which is the seventeenth invention, comprises preparing the silver thin film which comprises granular silver particles having an average particle size of 0.005 to 0.2 μm in the presence of a compound which becomes a solvent of silver halide. The silver thin film thus prepared shows good ablation suitability and good ink receptivity.

Among the present invention, the process for making a lithographic printing plate which is the eighteenth invention, comprises preparing the silver thin film which comprises granular silver particles having an average particle size of 0.005 to 0.2 μm on the aluminum base in the presence of an amine compound. The lithographic printing material formed by the process is excellent in ablation suitability and has excellent printability.

Among the present invention, in the process for making a lithographic printing plate, which is the nineteenth invention, as the compound used in the fifteenth and eighteenth inventions, the following compound represented by the formula (I) is used.

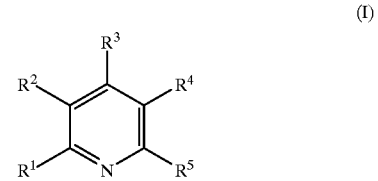

wherein at least one of $R^1$, $R^2$, $R^3$, $R^4$ and $R^5$ represents a substituted or unsubstituted amino group; and the remaining substituents each represent a hydrogen atom, a halogen atom, a substituted or unsubstituted saturated or unsaturated alkyl group, cycloalkyl group, alkoxy group, aryl group, alkanoyl group, aroyl group or heterocyclic group, or adjacent two of these substituents may form a ring.

Among the present invention, in the process for making a lithographic printing plate, which is the twentieth invention, when the silver thin film comprising granular silver particles is formed in the presence of an amine, or when the silver halide thin film comprising granular silver particles having an average particle size of 0.005 to 0.02 μm in the presence of a solvent for silver halide, an aluminum base having a high surface activity is used.

Among the present invention, in the process for making a lithographic printing plate, which is the 21st invention, as the aluminum base to be used in the twentieth invention, an aluminum base subjected to graining treatment, then a treatment with an acidic solution and thereafter subjected to anodizing treatment is used. This aluminum base has a surface activity which can form preferred physical development silver, and by using the aluminum base, an adhesive force between a silver thin film and the aluminum base become firm whereby runlength of the lithographic printing plate is improved. The lithographic printing plate precursor formed by the process is particularly excellent in ablation suitability and has more excellent printability.

According to the present invention, by exposing a desired image using a laser beam, it is not necessary to use a liquid developing agent or apparatuses for conducting the processing, and a lithographic printing plate can be easily and simply made. Moreover, it is possible to carry out the operation from a plate making step from a raw plate for lithographic printing to a printing step under a room light. Also, the present invention has merit that the lithographic printing plate precursor can be stored for a long period of time stably.

In the following, the present invention is explained by referring to the drawing.

FIG. 1 is a schematic sectional view showing one example of using an aluminum base as a support among the lithographic printing material according to the present invention. A lithographic printing plate precursor (a) according to the present invention has a layer 2 in which the surface of an aluminum base 1 is grained and anodized, and a silver thin film 3 is formed on the layer. As a process for making a lithographic printing plate according to the present invention, exposure is carried out to the lithographic printing plate precursor (a) by a laser beam with a desired image (non-image area exposure). Here, an adhesive force of the silver thin film 3 to the surface of the aluminum base becomes weak by the laser exposure and the area can be removed by a means such as vacuum suction or the like. Thus, an anodized aluminum surface layer 2 is exposed to complete a plate-making procedure. Thereafter, when the plate is mounted on a lithographic printing machine, an ink is accepted on the portion of the remaining silver thin film 3 while water is accepted on the grained and anodized aluminum surface layer 2 which is exposed to the surface whereby printing can be carried out.

The grained and anodized aluminum base to be used in the present invention has a good surface activity, capable of removing the silver thin film by a laser exposure, and the aluminum surface and said silver thin film are firmly adhered to provide a plate having an excellent surface activity. The surface activity means an activity which can form physical development silver of 0.5 g/m$^2$ or more by processing with the above-mentioned physical developing solution 1 at 23° C. for 30 minutes. If the plate has the surface activity of less than 0.5 g/m$^2$, it is poor in runlength.

As the aluminum base to be used in the support of the present invention, there may be preferably mentioned, for example, pure aluminum, or an aluminum alloy plate containing a small amount of a various kinds of metals such as silicon, magnesium, iron, copper, zinc, manganese, chromium, titanium, or the like. A minute amount of inevitable impurity metals contained in aluminum or a small amount of metals to be optionally added to aluminum gives remarkable effects on the size, shape and distribution of pits of unevenness obtained by electrolysis, and further gives marked effects on the strength of the aluminum base.

The above-mentioned aluminum base is generally subjected to a surface treatment to make a support for offset printing plate. In the surface treatment, respective treatments of degreasing, graining, desmutting, and anodizing are generally carried out and the base is continuously treated by using a coil made of aluminum. After the respective treatments, water washing is carried out depending on necessity following by drying to give a support.

In the case of an aluminum base for offset printing plate as described, for example, in Japanese Patent Application No. 51712/1997 (Japanese Provisional Patent Publication No. 244775/1998), an anodized film prepared by anodization which is the final step is not necessarily exposed as such to the uppermost surface, and it can be expected that a modified layer formed by the treatment immediately before the anodization is present on the surface of the oxidized film. It can be expected that the characteristics of these modified layers give marked effects when a photosensitive layer is coated thereon. However, in the already existing presensitized plate or OPC printing plate, the photosensitive layer is generally formed by coating a photosensitive material with an organic solvent so that it is a rare case in which effects of these modified layers appear. In the present invention, however, when an adhesive force between the silver thin film and the surface of aluminum gives marked effects on runlength, effects of these modified layers appear. A chemical treatment such as desmutting treatment immediately before anodization is preferably carried out by using an acidic treatment solution, particularly preferably a treatment solution containing nitric acid.

An aluminum treatment step is described in detail in Japanese Patent Application No. 51712/1997 (Japanese Provisional Patent Publication No. 244775/1998) which is incorporated in this application as a reference, and by using the method described therein, a grained and anodized aluminum base can be prepared.

In the present invention, the desmutting treatment is an important step among the surface treatments. An aluminum base subjected to graining treatment by electrolysis is washed sufficiently, but on the surface thereof, smuts are adhered and cannot be removed only by washing, and they block pits. In order to remove the smuts, a desmutting treatment is carried out. By the desmutting treatment, smuts are dissolved in the treatment solution to expose a pit surface. An amount of dissolution thereof may vary depending on the treatment conditions by the above-mentioned electrolyte, but it is suitably 0.1 to 1 g/m$^2$.

In the desmutting treatment, an alkali agent such as sodium hydroxide or the like to be used for the degreasing treatment, or an acid such as phosphoric acid, sulfuric acid, nitric acid, perchlorate, or the like, or a mixture thereof may be used. There is difference in smut-removing ability so that the respective compounds are used by adjusting their removing ability depending on the kinds or concentrations of processing solutions or processing temperature. When the desmutting treatment is too strong, unevenness formed at the step of graining is dissolved and made plain. When it is too weak, smut is unlikely remained. The remaining smut still remains after anodizing treatment as such to become a cause of an abnormal point at the time of forming a silver thin film.

The desmutting treatment by an acidic treatment solution to be used in the present invention provides a surface activity which can form preferred physical development silver. An acidic treatment solution containing nitric acid is particularly preferred since its ability to form physical development nuclei is high, and adhesiveness of the developed image silver is good so that a printing plate having large runlength can be prepared. When the smut can be hardly removed by the acidic treatment solution, by carrying out two-step treatment, for example, firstly desmutting with an alkali and then treating with an acidic treatment solution whereby a desmutting treatment without remaining the effect of an alkali can be carried out.

The thickness of the anodized film on the aluminum base to be used in the present invention is preferably 0.6 µm or more. The thickness of anodization can be changed by a current density and a time of the treatment. If it is less than 0.6 μm, an adhesive strength between the silver thin film comprising physical development silver formed by the silver complex diffusion transfer process and the aluminum base is lowered so that lowering in runlength is seen, and a silver film removing property by a laser-beam exposure is lowered. When the processing cost is considered, it is preferably 0.6 to 3 μm.

In the aluminum base to be used in the present invention, a ratio of an anodized amount AW to a centerline surface roughness Ra, AW/Ra is preferably 5 or more. Ra is regulated by JIS B 0601, and the unit of Ra is μm, while that of AW is g/m$^2$. Thus, in the present invention, AW/Ra is represented by an algebraic ratio. The centerline surface roughness Ra is mainly determined by the graining step. When the ratio AW/Ra is made larger, uniformity of dot exposed by a laser beam is improved. When the ratio AW/Ra is less than 5, lowering in runlength or lowering in uniformity of dot by a laser beam is observed.

In the present invention, by coating a solution containing silver ions on a graining treated and anodizing treated aluminum base, physical development nuclei are formed, and then, subjecting to silver complex salt diffusion transfer development, a silver thin film can be formed. The solution containing silver ions may be, for example, a silver halide emulsion or a silver nitrate aqueous solution, preferably a solution containing a hydrophilic binder and a water-soluble silver salt. In this case, a silver ion concentration in the coating solution is necessary to be $10^{-8}$ mole/liter or more. The water-soluble silver salt may include, for example, silver nitrate, silver perchlorate, or the like, or may be a silver salt compound which is made complex salt by a silver halide solvent such as ammonia and an alkanolamine, etc. As the hydrophilic binder, there may be mentioned gelatin, starch, dialdehyde starch, carboxymethyl cellulose, gum arabic, sodium alginate, hydroxyethyl cellulose, polystyrenesulfonic acid, sodium polyacrylate, a copolymer of vinylimidazole and acrylamide, a copolymer of acrylic acid and acrylamide, a hydrophilic polymer such as polyvinyl alcohol or the like, or an oligomer thereof, and a content thereof is preferably 0.5 g/m$^2$ or less.

In the present invention, when the grained and anodized aluminum base is treated by a metal salt solution of zinc or a metal noble in a standard electrode potential than zinc, preferred results can be obtained. When the aluminum base is treated by a metal salt solution of zinc or a metal noble in a standard electrode potential than zinc, substitution reaction occurs and aluminum at the surface is substituted by other metal. Since the step of anodization is generally carried out in a high concentration electrolyte, the surface of the aluminum support is washed with the electrolyte. Also, when the anodization is continuously carried out, an indirect electrical supply system is employed in many cases, and in this case, prior to anodization, it is electrically washed and dissolved at a cathode. However, it is found that the substituted metal at the prior treatment is at most oxidized and remains with a considerable amount. If the remaining metal or an oxide thereof has a level capable of receiving an electron from a reducing agent in a developing solution, the portion acts as the physical development nucleus so that it is possible to cause chemical adsorption of the above-mentioned physical development silver and the aluminum support.

In the present invention, the standard electrode potential means a relative electrode potential when the standard hydrogen electrode at 25° C. is made $E_0$=0V, and, for example, zinc is −1.662V and copper is +0.337V. More specifically, it is described in IUPAC Electrochemical Commission, G. Charlot ed., "Selected Constants: Oxidation-Reduction Potentials in Aqueous Solution", Butterworth & Co., Ltd. London (1971).

Pre-treatment of aluminum is generally carried out in the order of degreasing, graining, desmutting and anodization, and the above-mentioned metal salt treatment shall be carried out after desmutting otherwise little effect can be obtained. Also, the metal salt treatment is preferably carried out before anodization, but may be carried out after anodization.

In the above-mentioned metal salt treatment solution, a single salt or a complex salt may be used. In the case of a single salt, it may be used in the form of a chloride, a sulfate, a hypophosphate, a phosphate, an organic acid salt such as an acetate and the like. In the case of a complex salt, as a complexing agent, there may be used an oxycarboxylic acid such as glycollic acid, lactic acid, tartaric acid, citric acid or the like and its alkali metal salt; a dicarboxylic acid such as malonic acid, succinic acid, maleic acid or the like and its alkali metal salt; an amine such as ammonia, triethanolamine, ethylenediamine, or the like; an amino acid such as glycine, alanine or the like; pyridine; ethylenediaminetetraacetic acid salt (EDTA) or the like. As a metal, those having the standard oxidization potential of a plus value are preferred and a metal of the group VIII of the periodic table is also preferred. Moreover, it is possible to use two kinds or more of metals in admixture. However, those, which are unstable and easily decomposed such as a silver ion, are not preferred in view of preparation stability. A concentration of the metal ion is preferably 0.001 to 5 mole/liter, more preferably 0.01 to 1 mole/liter. Also, the temperature of the solution is preferably 20 to 50° C. The processing time varies depending on the temperature, concentration, kinds of the metal salt to be used or the like, but preferably 20 to 60 seconds.

Moreover, to the above-mentioned metal salt, treatment solution, a pH adjusting agent, a buffer such as a carbonate buffer, a borate buffer or the like, a stabilizer such as urea, thiourea or the like, a surfactant or the like may be added.

Aluminum is generally an active metal, and in air, an oxidized film is naturally formed with a thickness of 1 to several nm. However, an alkali resistance of the oxidized film is weak so that an anodized film is formed to improve alkali resistance. The thicker the oxidized film is, the larger the alkali resistance is. In the support for offset printing plate, a porous anodized film is formed as an oxidized film to improve water retentivity o the surface and adhesiveness of the photosensitive layer. In this case, an alkali resistance is markedly affected by a thickness of a barrier layer at the bottom portion of the formed micropore rather than the total thickness of the oxidized film. As for such a behavior of formation and dissolution of the porous anodized film, there is a study by Nagayama, Takahashi, et al. (Metal Surface Techniques, vol. 30, p. 438, 1979). It can be considered that the dissolution occurs to broaden the micropore so that the thickness of the barrier layer affects to alkali resistance than the total thickness. The thickness of the barrier layer increases with a ratio of about 1 nm/v based on the electrolysis voltage at the time of anodization. However, at the constant voltage, the thickness of the barrier layer is not changed even when the total thickness of the oxidized film is increased, and it is 10% or less based on the total thickness of the whole oxidized film in a support for a printing plate. And yet, there is a limitation in an electrolysis voltage which can be applied to an electrolyte. When sulfuric acid is used as an electrolyte, which is generally used for use in a printing plate and has good productivity, the limit is 30 to 40 V. Thus, it is difficult to make the thickness of the barrier layer thicker by the above constitution.

In the present invention, after forming a porous anodized film, the aluminum base is dipped in a neutral electrolyte, and a pore filling treatment is carried out by raising an electrolysis voltage whereby the thickness of the barrier layer at the bottom portion of the micropore is made thick. In this case, electrolysis occurs at the bottom portion of the micropore of the porous anodized film, and insides of the pores are filled with an oxide of aluminum with a lapse of time. The pore filling treatment is preferably stopped when 80% of the depth of the micropores are filled in order to maintain both of good retentivity and adhesiveness. According to the pore filling treatment, the thickness of the porous anodized film can be made thick without impairing alkali resistance. The alkali resistance of such an oxidized film can be easily evaluated by immersing in an aqueous sodium hydroxide solution. Also, the thickness of the barrier layer can be measured by observing the sectional view of the oxidized film with a transmission type electron microscope.

In the present invention, the pore filling treatment is carried out by using a neutral electrolyte, for example, boric acid or a mixture of boric acid and borax, or the like. For the treatment, the similar electrolytic cell as that used in anodization, and the electrolysis conditions are sufficient with a current density of 0.1 to 1 $A/dm^2$, a voltage of 50 to 300 V, and a treatment time of 10 to 120 sec. Improvement in alkali resistance by the pore filling treatment can be easily measured by comparing the degree of corrosion by immersing an aluminum base in an alkali solution for a certain period of time.

The silver thin film of a lithographic printing plate precursor according to the present invention can be formed by a general means for forming a metal thin film such as vacuum deposition, sputtering, CVD (Chemical Vapor Deposition), plating, or the like. On the other hand, the silver thin film can be formed by using a method of physical development according to the silver complex diffusion transfer process. According to this method, the silver thin film which becomes an image area when the aluminum base is used as a printing plate comprises fine granular metal silver, and an oleophilic compound can be adsorbed at the surface thereof. Thus, adsorption of ink becomes better than those prepared by other methods, and by making the anodized aluminum base hydrophilic by coating a gum, printability corresponding to those of a presensitized plate can be obtained.

In the present invention, it is preferred to provide a physical development nuclei layer on the grained and anodized aluminum support. The physical development nuclei layer comprises physical development nuclei and, if necessary, a hydrophilic polymer. As the physical development nuclei, there may be mentioned a metal colloid fine particle of silver, antimony, bismuth, cadmium, cobalt, lead, nickel, palladium, rhodium, gold, platinum, or the like, or a sulfide, a polysulfide, a selenide of these metals, or a mixture thereof, or a mixed crystal thereof. A hydrophilic polymer maybe contained in the physical development nuclei layer. As the hydrophilic polymer, there may be mentioned gelatin, starch, dialdehyde starch, carboxymethyl cellulose, gum arabic, sodium alginate, hydroxyethyl cellulose, polystyrenesulfonic acid, sodium polyacrylate, a copolymer of vinyl imidazole and acrylamide, a copolymer of acrylic acid and acrylamide, a hydrophilic polymer such as polyvinyl alcohol or the like, or an oligomer hereof. An amount to be contained thereof is preferably 0.5 $g/m^2$ or less. Moreover, in the physical development nuclei layer, a developing agent such as hydroquinone, methyl-hydroquinone, catechol or the like; and a known film-hardening agent such as formalin, dichloro-s-triazine or the like may be contained.

In the present invention, there are preferred systems when the above-mentioned silver complex diffusion transfer process. In the following, representative systems among these are mentioned.

As the first system, a silver thin film is formed by passing, in a physical development solution, a material in which a physical development nuclei layer is provided on a grained and anodized aluminum base and a material in which a silver halide emulsion is coated on a support as a donor for the silver complex salt, then, these materials are piled up and subjected to diffusion transfer development to precipitate silver on the physical development nuclei. Examples of employing such a system to form a silver thin film may include Copyrapid (trade name, available from Agfa Gevaert) or the like.

As the second system, a material, in which a silver halide emulsion layer is provided as a donor for the silver complex salt on the above-mentioned aluminum base to which a physical development nuclei layer is provided, is subjected to physical development processing, and then, the silver halide emulsion layer is washed-off to form a silver thin film on the physical development nuclei. In a mono-sheet type, a distance of diffusion from the silver halide emulsion layer is short so that diffusion to the lateral direction is a little and high resolution can be preferably obtained. Examples of employing such a system to form a silver thin film may include Silver Digiplate SDP-αR (trade name, available from Mitsubishi Paper Mills Ltd.), Silverlith SDB (trade name, available from E. I. Du Pont) or the like.

As the third system, the above-mentioned aluminum base to which a physical development nuclei layer is provided is immersed in a solution containing a silver complex salt dissolved by a silver halide solvent, and a reducing agent, to form a silver thin film on the physical development nuclei. This system has been known as the electroless plating system, and disclosed in, for example, Japanese Patent Publications No. 23745/1967 and No. 12862/1968, and Japanese Provisional Patent Publication No. 287542/1993.

In the present invention, a silver thin film comprising silver particles having an average particle size of 0.005 to 0.2 $\mu$m is used. The silver thin film comprising such silver particles is easily removed by exposure using a heat-mode laser beam and its printability is excellent. A silver thin film comprising silver particles having an average particle size of more than 0.2 $\mu$m or a vacuum deposited silver thin film are poor in ink adhesion, and as a result, image quality of the printed matter becomes poor.

Three types of systems of the silver complex diffusion transfer processes have been known as representative methods for preparing a silver thin film which is constituted by granular silver particles. Among these three types of systems, the first two systems have been practically used in a plate making camera or a photo-mode laser exposing machine. An average particle size of silver particles formed by these methods depends on plate-constituting elements such as the layer constitution of a plate, a halogen composition of a silver halide emulsion, an average particle size of emulsion particles, a development inhibitor or the like; elements for constituting a diffusion transfer development solution such as a developing agent, a silver halide emulsion, a development inhibitor or the like; and conditions of the diffusion transfer development processing. As for these factors, there are disclosed, for example, in U.S. Pat. Nos. 3,728,114, 4,134,769, 4,160,670, 4,336,321, 4,501,811, 4,510,228 and 4,621,041, Japanese Provisional Patent Publications No. 260491/1988, No. 116151/1991 and No. 282295/1992 or the like. For controlling the silver particles constituting the silver thin film to 0.2 μm or less, it can be accomplished by optimizing these known techniques.

As for the third system, by optimizing the composition of the processing solution constituted by a developing agent, a silver halide solvent, silver salt, etc. according to the techniques silver particles constituting the silver thin layer can be controlled to 0.005 to 0.2 μm.

As a method for measuring the particle size of silver particles constituting a silver thin film, there may be mentioned a method in which the silver thin film is photographed and the sizes of the respective silver particles in the photograph are measured, and an average value is calculated therefrom. As a simple and easy method, mean-sized particles are picked up and the sizes of these particles may be measured.

As a solvent for silver halide to be used in the present invention, there may be mentioned a sulfite (for example, anhydrous sodium sulfite, anhydrous potassium sulfite, etc.), a thiosulfate (for example, sodium thiosulfate pentahydrate, ammonium thiosulfate, etc.) or the like. These solvents may be used singly or in combination of two or more.

The solvent for silver halide is preferably used in an amount of 0.1 to 100-fold moles, more preferably 1 to 50-fold moles based on an amount of the silver ions.

An amine compound to be used in the present invention is ammonia, or a saturated or unsaturated amine which may be substituted by an alkyl group, a cycloalkyl group, an alkoxy group, an aryl group, an alkanoyl group, an aroyl group or a heterocyclic group, and these substituents may form a ring by combining with each other. These amine compounds may be used singly or in combination of two or more.

The above-mentioned amine may be used in an amount of 0.1 to 100-fold moles, more preferably 1 to 50-fold moles based on 1 mole of the silver ion.

As an amine to be used in the present invention, the compound represented by the above formula (I) is preferably used.

In the compound of the formula (I), when the amino group has a substituent, said substituent is a substituted or unsubstituted, and a saturated or unsaturated alkyl group, cycloalkyl group, alkoxy group, aryl group, alkanoyl group, aroyl group or heterocyclic group, and two of adjacent these substituents may form a ring by combining with each other.

As the halogen atom, there may be mentioned a chlorine atom, a bromine atom, an iodine atom or the like.

The above alkyl group may be further substituted by a suitable group (for example, a halogen atom, an alkoxy group, etc.). In the present invention, preferred alkyl group is that having 1 to 10 carbon atoms, more specifically, a methyl group, an ethyl group, an n-propyl group, an n-hexyl group, a tri-chloromethyl group, a vinyl group or the like.

The above cycloalkyl group is a cycloalkyl group having 3 to 10 carbon atoms or so, and may be further substituted by a suitable group (for example, an alkyl group, a halogen atom, an alkoxy group, etc.). Specific examples thereof may include a cyclohexyl group, a cyclopentyl group or the like.

The above alkoxy group may be a straight or branched one, and may be further substituted by a suitable group (for example, an alkyl group, a halogen atom, an alkoxy group, etc.). Preferred alkoxy group is that having 1 to 10 carbon atoms, more specifically, a methoxy group, an ethoxy group, an n-propoxy group, an n-hexyloxy group or the like.

As the above aryl group, an aromatic group such as a phenyl group, a naphthyl group or the like are preferred, and these aromatic group may be substituted by a suitable group (for example, a halogen atom, an alkyl group, an alkoxy group, a nitro group, etc.).

As the above alkanoyl group, a straight or branched alkanoyl group having 1 to 6 carbon atoms may be mentioned, and specifically mentioned are a formyl group, an acetyl group, a propionyl group, a pivaloyl group or the like.

As an aryl group portion of the above aroyl group, an aromatic group such as a phenyl group, a naphthyl group or the like are preferably mentioned. These aromatic group may be substituted by a suitable group (for example, a halogen atom, an alkyl group, an alkoxy group, a nitro group, etc.).

As the above heterocyclic group, there may be mentioned, for example, a substituted or unsubstituted pyridyl group, furyl group or the like.

In the following, specific examples of the amine compound are shown but these examples do not limit the present invention.

| | |
|---|---|
| A1 | $NH_3$ |
| A2 | $NH_2CH_2CH_3$ |
| A3 | $NH(CH_2CH_3)_2$ |
| A4 | $N(CH_2CH_3)_3$ |
| A5 | $NH_2CH_2CH_2OH$ |
| A6 | $NH(CH_2CH_2OH)_2$ |
| A7 | $N(CH_2CH_2OH)_3$ |
| A8 | $CH_3NHCH_2CH_3$ |
| A9 | $NH_2CH_2CH_2NHCH_2CH_3$ |
| A10 | $NH_2CH_2CH_2NHCH_2CH_2OH$ |
| A11 | 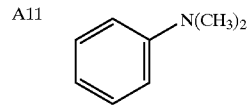 |
| A12 | 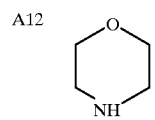 |
| A13 | 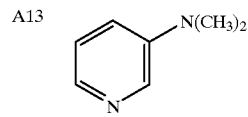 |

These amine compounds are preferably used in an amount of 0.1 to 100-fold moles, more preferably 1 to 50-fold moles based on 1 mole of the silver ion.

Also, in the present invention, a compound represented by the above formula (I) is preferred as the amine compound.

Specific examples of the compound represented by the formula (I) are enumerated below.

AP1

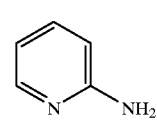

AP2 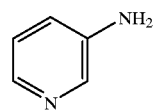

AP3 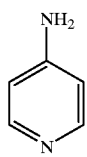

AP4 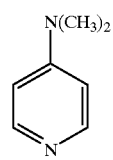

AP5 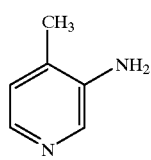

AP6 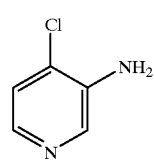

AP7 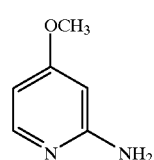

AP8 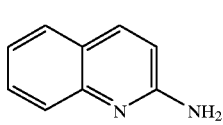

AP9 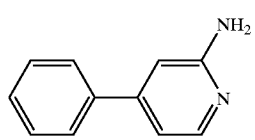

AP10 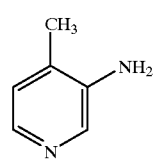

AP11 

AP12 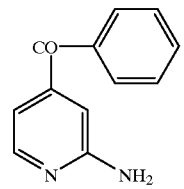

AP13 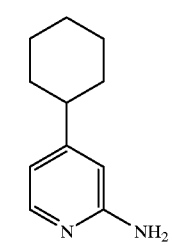

AP14 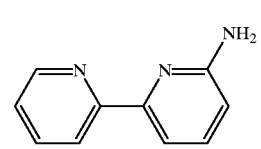

These amine compounds are preferably used in an amount of 0.1 to 100-fold moles, more preferably 1 to 50-fold moles based on 1 mole of the silver ion.

In the process for making a lithographic printing material according to the present invention, an efficiency of removing the silver thin film (i.e., it can be said to be a sensitivity of a lithographic printing plate of the process of the present invention) depends on a thickness of the silver thin film, but the thickness is thin, runlength is lowered. Thus, the thickness of the silver thin film is preferably determined by a laser output power to be used in imaging. If the output power is 1 W or more, it can be made thick, but when it is less than 1 W, the film thickness is preferably set within the range of 0.05 to 5 μm.

In the present invention, the kind of a photosensitive silver halide to be used depending on necessity is selected from a generally employed silver chloride, silver bromide, silver iodide, silver chlorobromide, silver chloroiodide, silver iodobromide, silver chloroiodobromide and so on. As the type of the emulsion, it maybe either of a negative type or a positive type, or may be a specific type using a photosensitive silver halide and an extremely low sensitive silver halide emulsion as disclosed in Japanese Provisional Patent Publication No. 48544/1979. To said silver halide emulsion, various kinds of chemical sensitization such as a noble metal sensitization, sulfur sensitization, reduction sensitization and sensitization maybe applied in combination of two or more of the above, or the like. Moreover, spectral sensitization may be further carried out depending on necessity by using a sensitizing dye such as cyanine, merocyanine or the like. Furthermore, an additive such as an antifoggant, a stabilizer, a surfactant may be added to the silver halide emulsion by the known method. Details of the photosensitive silver halide emulsion and a process for producing the same are disclosed in Japanese Provisional Patent Publication No. 55402/1974 and the like. Also, an over layer such as a halation preventive layer may be provided depending on necessity in order to improve sharpness of the image.

In the present invention, as a hydrophilic binder of a silver halide emulsion layer to be used depending on necessity, there may be used gelatin, various kinds of gelatin such as a gelatin derivative, a grafted gelatin, etc.; and a hydrophilic polymer compound such as polyvinylpyrrolidone, various kinds of starches, albumin, polyvinyl alcohol, gum arabic, hydroxyethyl cellulose, etc. may be also used. As the gelatin to be used here, any gelatin which is prepared from collagen obtained from animal can be used and gelatin prepared from collagen obtained from pigskin, cattle skin and cattle bone is preferred. Also, there is no specific limitation about the kind of gelatin, and there may be mentioned a lime-treated gelatin and an acid-treated gelatin, and also gelatin derivatives as disclosed in Japanese Patent Publications No. 4854/1963, No. 5514/1964, No. 12237/1965 and No. 26345/1967; U.S. Pat. Nos. 2,525,753, 2,594,293, 2,614,928, 2,763,639, 3,118,766, 3,132,945, 3,186,846 and 3,312,553; G.B. Patent No. 1,033,189 or the like. These materials may be used singly or in combination of two or more.

Among the present invention, as a support to be used in the fifteenth to eighteenth invention other than the aluminum base, there may be used paper, various kinds of films, plastic, paper to which a resinous substance is coated, metal, or a material in which a polyester film or paper is laminated to the above-mentioned supports.

At the back surface of the support, a layer containing a matte agent or an antistatic agent may be provided in view of transferability in the imaging apparatus.

When a silver thin film is formed by using a silver halide emulsion, coating of the silver halide emulsion layer or a development processing for formation of the silver thin film are carried out in a dark room to avoid fogging of the silver halide emulsion. This development processing may be carried out continuously as the post treatment of the lithographic printing material.

A development processing solution for forming a silver thin film may contain an alkaline substance such as sodium hydroxide, potassium hydroxide, lithium hydroxide, sodium tertiary phosphate, or the like; a preservative such as a sulfite; a silver halide solvent such as a thiosulfate, a thiocyanate, a circular imide, 2-mercaptobenzoic acid, an amine compound, or the like; a thickening agent such as hydroxyethyl cellulose, carboxymethyl cellulose or the like; an antifoggant such as potassium bromide, a compound as disclosed in Japanese Provisional Patent Publication No. 26201/1972, a developing agent such as a hydroquinone compound, catechol, 1-phenyl-3-pyrazolidone or the like; a development modifier such as a polyoxyethylene compound, an onium compound or the like. Moreover, in the development processing solution, a compound which improves ink receptivity at the surface of the silver thin film may be used as disclosed in U.S. Pat. No. 3,776,728.

The silver thin film after physical development of the lithographic printing material according to the present invention is preferably modify the ink receptive property or strengthen the receptivity thereof by an optional known surfactant. Such processing solutions are disclosed, for example in Japanese Patent Publication No. 29723/1973, U.S. Pat. No. 3,721,559 or the like.

In the plate making method of a lithographic printing plate according to the present invention, as a laser to be used for exposing the anodized surface, there may be mentioned a gas laser such as a carbonic acid gas laser, a nitrogen laser, an Ar laser, an He/Ne laser, an He/Cd laser, a Kr laser or the like; a liquid (dye) laser; a solid laser such as a ruby laser, an Nd/YAG laser or the like; a semiconductor laser such as a GaAs/GaAlAs laser, InGaAs laser or the like; an eximer laser such as a KrF laser, a XeCl laser, a XeF laser, an $Ar_2$ laser or the like.

In the present invention, in order to promote removal of a silver thin film by a laser exposure and to improve an efficiency of exposing an anodized aluminum surface layer (i.e., it can be said to be a sensitivity of a lithographic printing plate of the process of the present invention), a light absorbing agent may be contained in either of a physical development nuclei layer or a support. By adding such an agent, even when part of the laser beam is passed through the silver thin film, energy of the laser beam can be absorbed at the layer under the silver thin film whereby thermal efficiency can be enhanced.

As the light absorbing agent, it may be a general dye or pigment, and may be mentioned, for example, carbon black, cyanine, non-metal or metal phthalocyanine, metal Dithiolene, anthraquinone and the like.

Also, when a light absorbing agent is contained in a grained and anodized aluminum base, a chemical or electrochemical metal coloring method generally called to as "black dying" can be employed. This method can be carried out by introducing a dye into fine pores possessed by the anodized film using an organic or inorganic dye by immersing the film in a dye solution, and then, subjecting to pore filling treatment to effect dying.

EXAMPLES

In the following, the present invention is explained in detail by referring to Examples, but the present invention is not limited by the following Examples so long as not exceeding the scope of the present invention.

Example 1

A JIS A 1050 type aluminum plate web having a width of 300 mm and a thickness of 0.2 mm was transferred with a processing rate of 1.3 m/min, and immersed in a 4% sodium hydroxide aqueous solution at 50° C. for 30 seconds and then washed with water. Thereafter, it was further immersed in an indirect electric supply system electrolytic cell filled with 1.5% hydrochloric acid at 20° C. and single-phase alternating electric current with 20 A/dm$^2$ and 50 Hz was passed therethrough from a power source for 60 seconds to effect an alternating electric current electrolytic graining treatment, and then washed with water. Then, the material was immersed in a 6% nitric acid aqueous solution at 60° C. for 30 seconds to effect desmutting, washed with water, passed into a 20% sulfuric acid at 25° C. for 60 seconds to effect anodizing treatment with a direct electric current of 5 A/dm$^2$ and washed with water. Thereafter, the material was dried to obtain an aluminum base (Aluminum base 1) for offset printing.

The thus prepared Aluminum base 1 was immersed in the following physical development solution 1 at 23° C. for 30 minutes to examine the surface activity, it was formed 0.84 g/m$^2$ of physical development silver.

Physical development solution 1 (1 part of Solution B was added to 5 parts of Solution A in volume ratio)

| Solution A: | Anhydrous sodium sulfite | 180 g |
| --- | --- | --- |
| | Silver nitrate (10% solution) | 75 ml |
| | Make up to 1000 ml with addition of water. | |
| Solution B: | Anhydrous sodium sulfite | 20 g |
| | Hydroquinone | 20 g |
| | Make up to 1000 ml with addition of water. | |

On Aluminum base 1 having the above surface activity, a nucleus coating solution (as a hydrophilic polymer, a copolymer of acrylamide and imidazole of No. 3 is contained in the ratio of 4 mg/m$^2$) described in Example 2 of Japanese Provisional Patent Publication No. 21602/1978 (corresponds to U.S. Pat. No. 4,160,670) was coated and dried to form a physical development nuclei layer.

The composition of the nucleus coating solution is as mentioned below.

| | |
|---|---|
| Palladium sulfide sol* treated by an ion-exchange resin | 100 ml |
| Polyfunctional polymer (Polymer No. 3)** | 0.2 g |
| 10% Saponine | 2 ml |
| Make up to two liters with addition of water. | |
| *Preparation of palladium sulfide sol treated by an ion-exchange resin: | |
| Solution C | |
| Palladium chloride | 5 g |
| Hydrochloric acid | 40 ml |
| Water | 1000 ml |
| Solution D | |
| Sodium sulfide | 8.6 g |
| Water | 1000 ml |
| Solution C and Solution D were mixed under stirring and after 30 minutes, the mixture was passed through a column of an ion-exchange resin (IR-120E and IRA-400; available from Rohm & Haas Co.) prepared for producing pure water to obtain the palladium sulfide sol. | |
| **Preparation of polyfunctional polymer (No. 3): | |
| First solution with the prescription mentioned below was added dropwise to Second solution maintained at 70° C. over 30 minutes and polymerization reaction was completed by further stirring for one hour. This solution was cooled and then added to 38 kg of methanol, and a precipitated synthetic resin was filtered and dried. The resulting resin does not have a carboxyl group and an average polymerization degree was 1000. | |
| First solution | |
| 95% Acrylamide | 8 mole |
| N-vinyl imidazole | 2 mole |
| Water | 480 g |
| Adjusted to pH = 5.4 ± 0.1 with nitric acid. | |
| Isopropyl alcohol | 3 mole |
| Second solution | |
| Ammonium persulfate | 4.6 g |
| Water | 3380 ml |

While maintaining an aqueous solution of inactive gelatin at 60° C. under vigorous stirring, a mixed aqueous solution of sodium chloride and potassium bromide (potassium bromide: 29.5 mole %) and an aqueous silver nitrate solution were simultaneously added to the gelatin solution to prepare a silver chlorobromide emulsion having an average particle size of 0.28 $\mu$m. Then, potassium iodide in an amount corresponding to 0.5 mole %/1 mole of Ag was added to the emulsion to effect surface substitution. The thus obtained silver halide emulsion containing the silver halide emulsion particles was coated on the above physical development nuclei layer and dried to prepare Lithographic printing material 1. The silver halide emulsion was a monodispersed silver chloroiodobromide emulsion containing 70% of silver chloride, 29.5% of silver bromide and 0.5% of silver iodide and 90% by weight of particles based on the total particles was within ±30% of the average particle size.

The thus obtained Lithographic printing material 1 was developed without exposure with the following diffusion transfer developing solution A at 23° C. for 20 seconds, and immediately after the gelatin layer was washed away with a flown water (washing off). Then, the material was treated by the following neutralizing solution A at room temperature for 15 seconds to prepare a lithographic printing plate precursor in which the silver thin film was exposed.

| | |
|---|---|
| Diffusion transfer developing solution A | |
| Water | 700 ml |
| Sodium hydroxide | 25 g |
| Anhydrous sodium sulfite | 120 g |
| Hydroquinone | 25 g |
| 4-hydroxymethyl-4'-methyl-3-pyrazolidone | 4 g |
| Ethylenediaminetetraacetic acid | 5 g |
| Sodium thiosulfate hexahydrate | 10 g |
| N-methylethanolamine | 40 g |
| Glycerin | 20 g |
| Water was further added to make up 1 liter. | |
| Neutralizing solution A | |
| Water | 600 ml |
| Citric acid | 20 g |
| Sodium citrate | 25 g |
| Monoethanolamine | 10 ml |
| 3-n-Octyl-5-mercaptoxadiazole | 0.6 g |
| Ethylene glycol | 5 ml |
| Water was further added to make up 1 liter. | |

The thus prepared Lithographic printing plate precursor 1 of the present invention was exposed with a YAG laser with a wavelength of 1064 nm at 8 W to expose an aluminum base surface whereby a lithographic printing plate was obtained.

The thus prepared lithographic printing plate was mounted on an offset printer (3200MCD, trade name, manufactured by Ryobi Imagics Co.) and when printing was carried out by 150,000 sheets, printed materials excellent in printing image quality without stain at a non-image area could be obtained. It was found that an excellent printing plate could be obtained when the aluminum base having high surface activity of the present invention was used.

Comparative Example

In the same manner as in Example 1 except for desmutting an aluminum base by immersing in a 4% caustic soda aqueous solution at 25° C. for 30 seconds in place of desmutting the same by immersing in a 6% nitric acid aqueous solution at 60° C. for 30 seconds, an aluminum base for offset printing (Aluminum base 2) was obtained.

The thus prepared Aluminum base 2 was immersed in the above-mentioned Physical development solution 1 at 23° C. for 30 minutes, an extremely small amount (0.14 g/m$^2$) of physical development silver was formed.

Thereafter, in the same manner as in Example 1, Lithographic printing plate 2 was prepared. As a result, a silver amount of the silver thin film was substantially the same as that of Lithographic printing plate precursor 1 of Example 1. Also, in the same manner as in Example 1, a lithographic printing plate was prepared and printing was carried out. As a result, an image area disappeared with 100 sheets of printing. It was found that when an aluminum base having a low surface activity was used, it does not at all act as a printing plate.

Example 2

In the same manner as in Example 1 except for desmutting an aluminum base by immersing in a 5% sodium carbonate aqueous solution at 25° C. for 30 seconds in place of desmutting the same by immersing in a 6% nitric acid aqueous solution at 60° C. for 30 seconds, an aluminum base for offset printing (Aluminum base 3) was obtained.

When the thus prepared Aluminum base 3 was immersed in the above-mentioned Physical development solution 1 at 23° C. for 30 minutes, 0.55 g/m² of physical development silver was formed.

Thereafter, in the same manner as in Example 1, Lithographic printing plate precursor 3 was prepared. As a result, a silver amount of the silver thin film was substantially the same as that of Lithographic printing plate precursor 1 of Example 1. Also, in the same manner as in Example 1, a lithographic printing plate was prepared and printing was carried out. As a result, printed materials excellent in printing image quality without stain at a non-image area can be obtained until 10,000 sheets of printing, but exceeding 10,000 sheets of printing, missing of an image at some areas occurred. Thus, it was found that this surface activity was the lower limit which could actually be used.

Example 3

In the same manner as in Example 1 except for desmutting an aluminum base by immersing in a 6% phosphoric acid aqueous solution at 60° C. for 30 seconds in place of desmutting the same by immersing in a 6% nitric acid aqueous solution at 60° C. for 30 seconds, an aluminum base for offset printing (Aluminum base 4) was obtained.

When the thus prepared Aluminum base 4 was immersed in the above-mentioned Physical development solution 1 at 23° C. for 30 minutes, 0.70 g/m² of physical development silver was formed Thereafter, in the same manner as in Example 1, Lithographic printing plate precursor 4 was prepared. As a result, a silver amount of the silver thin film was substantially the same as that of Lithographic printing plate precursor 1 of Example 1. Also, in the same manner as in Example 1, a lithographic printing plate was prepared and printing was carried out. As a result, printed materials excellent in printing image quality without stain at a non-image area can be obtained until 100,000 sheets of printing. It was found that when the aluminum base having a high surface activity of the present invention was used, an excellent printing plate could be obtained.

Example 4

On the aluminum base (Aluminum base 1) for offset printing prepared in Example 1, metal silver was vapor deposited under heating by a vacuum deposition apparatus under a vacuum of 1 mPa or less at 1 A/sec to form a silver thin film with a thickness of 0.05 μm whereby Lithographic printing plate precursor 5 was prepared. Then, Lithographic printing plate precursor 5 was exposed by a YAG laser in the same manner as in Example 1, about twice of energy was required to remove the silver thin film as compared with Example 1, and an area which was somewhat insufficient in removal of the silver thin film was observed. Also, in the same manner as in Example 1, printing was carried out. As a result, printed materials excellent in printing image quality without stain at a non-image area were obtained until 50,000 sheets of printing. However, exceeding 50,000 sheets of printing, missing of an image at some portions occurred. From the above results, it was found that the physical development silver formed by the silver complex diffusion transfer process is excellent in plate-making procedure or printing characteristics as compared with that prepared by chemical deposition.

Example 5

By using the aluminum base (Aluminum base 3) for offset printing prepared in Example 2, Lithographic printing plate precursor 6 was prepared in the same manner as in Example 2 except for conducting coating of an emulsion without conducting coating physical development nuclei. The plate precursor 6 had the same degree of the silver amount in the silver thin film as the Lithographic printing plate precursor 1 of Example 1. Then, a lithographic printing plate was prepared in the same manner as in Example 1 and printing was carried out. As a result, printed materials excellent in printing image quality without stain at a non-image area were obtained until 50,000 sheets of printing. However, exceeding 50,000 sheets of printing, missing of an image at some portions occurred. It was found that this level of the surface activity is within the actually usable range.

Example 6

When a sectional view of an anodized film of the aluminum base (Aluminum base 1) for offset printing prepared in Example 1 was observed by an electron microscope, it had a thickness of 1.4 μm.

Next, an aluminum base (Aluminum base 5) for offset printing was prepared in the same manner as in Example 1 except for shortening the anodization time to 25 seconds. When a sectional view of an anodized film of the thus prepared aluminum base 5 was observed by an electron microscope, it had a thickness of 0.55 μm.

When the thus prepared Aluminum base 5 was immersed in the above-mentioned Physical development solution 1 at 23° C. for 30 minutes, 0.60 g/m²of physical development silver was formed.

Thereafter, in the same manner as in Example 1, Lithographic printing plate precursor 7 was prepared. As a result, a silver amount of the silver thin film was substantially the same as that of Lithographic printing plate precursor 1 of Example 1. Also, Lithographic printing plate precursor 7 was exposed by a YAG laser in the same manner as in Example 1, an area which was somewhat insufficient in removal of the silver thin film was observed. Also, in the same manner as in Example 1, printing was carried out by using the thus prepared lithographic printing plate 7. As a result, printed materials excellent in printing image quality without stain at a non-image area were obtained until 5,000 sheets of printing. However, exceeding 5,000 sheets of printing, missing of an image at some portions occurred. From the above results, it was found that good results could be obtained when an aluminum base having an anodized film thickness of 0.6 μm or more was used.

Example 7

By changing the conditions for graining treatment and anodization treatment, four kinds of aluminum bases for offset printing having an anodized amount AW and a centerline surface roughness Ra as shown in Table 1 were prepared. Here, the measurement of the anodized amount AW was carried out in accordance with JIS H 8680 7. "Film measurement method", and the measurement of the centerline surface roughness Ra was carried out in accordance with JIS B 0601.

When the thus prepared Aluminum bases were immersed in the above-mentioned Physical development solution 1 at 23° C. for 30 minutes, each 0.50 g/m² or more of physical development silver was formed.

Thereafter, in the same manner as in Example 1, Lithographic printing plate precursors shown in Table 1 were prepared. Also, in the same manner as in Example 1, lithographic printing plates were prepared and printing was carried out by using the same. The results are shown in Table 1.

TABLE 1

| | Anodized amount AW (g/m$^2$) | Center line surface roughness Ra (μm) | Ratio AW/Ra | Number of printed sheets (sheets) | Dot uniformity |
|---|---|---|---|---|---|
| Lithographic printing plate 8 | 4.0 | 0.6 | 6.7 | 150,000 | Good |
| Lithographic printing plate 9 | 2.5 | 0.5 | 5.0 | 100,000 | Good |
| Lithographic printing plate 10 | 2.0 | 0.5 | 4.0 | 50,000 | Slightly inferior |
| Lithographic printing plate 11 | 2.5 | 0.7 | 3.6 | 70,000 | Slightly inferior |

As can be seen from the results of Table 1, in the lithographic printing plates 8 and 9 having a ratio of AW/Ra of 5 or more, both of runlength and dot uniformity are good, whereas the lithographic printing plates 10 and 11 having a ratio of AW/Ra of less than 5.0, they are slightly inferior in dot uniformity to those of the lithographic printing plates having the ratio of 5 or more. From the results of this Example, it was found that when an aluminum base having the ratio of the anodized amount AW relative to the center line surface roughness Ra (AW/Ra) of 5 or more is used, lithographic printing plates excellent in runlength and dot uniformity can be obtained.

Example 8

By using the aluminum base (Aluminum base 1) for offset printing prepared in Example 1, Lithographic printing plate precursor 12 was prepared in the same manner as in Example 1 except for conducting coating of an emulsion without conducting coating physical development nuclei. The plate precursor 12 had the same degree of the silver amount in the silver thin film as the Lithographic printing plate precursor 1 of Example 1. Then, a lithographic printing plate 12 was prepared in the same manner as in Example 1 and printing was carried out. As a result, printed materials excellent in printing image quality without stain at a non-image area were obtained until 100,000 sheets of printing. The number of the printed sheets (i.e., runlength) were inferior to that of Lithographic printing plate 1, but it was a sufficient level.

Example 9

On the aluminum base (Aluminum base 1) for offset printing prepared in Example 1 was coated a hydrophilic polymer solution containing $10^{-6}$ mole/liter of silver nitrate to form a physical development nuclei layer. As the hydrophilic polymer, a copolymer of acrylamide and imidazole of No. 3 is contained in the ratio of 4 mg/m$^2$ described in Example 2 of Japanese Provisional Patent Publication No. 21602/1978 is used.

Thus, in the same manner as in Example 1, Lithographic printing plate precursor 13 was prepared. The thus prepared Lithographic printing plate precursor 13 was exposed by a YAG laser with a wavelength of 1064 nm at 8 W to expose an aluminum base surface whereby Lithographic printing plate was obtained.

The thus obtained Lithographic printing plate 13 was mounted on an offset printer (3200MCD, tradename, manufactured by Ryobi Imagics Co.), and printing was carried out by 100,000 sheets. As a result, printed materials excellent in printing image quality without stain at a non-image area were obtained. According to the present invention, it was found that a lithographic printing plate excellent in printing characteristics can be obtained.

Example 10

An aluminum plate (material: JIS A 1050) having a thickness of 0.3 mm was subjected to degreasing treatment with a 4% sodium hydroxide aqueous solution at 50° C. for one minute and washed with water. Then, the plate was subjected to electrolytic graining treatment at 20° C. with an alternating current density of 50 A/dm$^2$ for 60 seconds, and then, desmutting treatment with a 20% phosphoric acid at 50° C. for one minute. Thereafter, the plate was subjected to meal salt treatment with a metal salt treatment solution 1 at 25° C. for 10 seconds, and then, subjected to anodization under the conditions of a 25% sulfuric acid solution at a temperature of 20° C., an electric current density of 3 A/dm$^2$ and a treatment time of 90 seconds to prepare Aluminum base 14.

| Metal salt treatment solution 1 | |
|---|---|
| Copper sulfate | 20 g |
| Hydrofluoric acid | 10 cc |
| Make up to 1 liter with addition of pure water. | |

When the thus prepared Aluminum base 14 was immersed in the above-mentioned physical development solution 1 at 23° C. for 30 minutes, 0.70 g/m$^2$ of physical development silver was formed.

Then, in the same manner as in Example 1, Lithographic printing plate precursor 14 was prepared. As a result, a silver amount of the silver thin film was substantially the same as that of Lithographic printing plate precursor 1 of Example 1. Also, in the same manner as in Example 1, a lithographic printing plate was prepared and printing was carried out. As a result, printed materials excellent in printing image quality without stain at a non-image area can be obtained until 100,000 sheets of printing. It was found that when the aluminum base of the present invention was used, an excellent printing plate could be obtained.

Example 11

In the same manner as in Example 1 except for processing with a metal salt processing solution 2 mentioned below at 40° C. for 30 seconds in place of processing with the metal salt solution 1 at 25° C. for 10 seconds, an aluminum base (Aluminum base 15) for offset printing was obtained.

| Metal processing solution 2 | |
|---|---|
| Sodium chloride | 20 g |
| Potassium chloride | 10 g |
| Make up to 1 liter with addition of pure water. | |

When the thus prepared Aluminum base 15 was immersed in the above-mentioned physical development solution 1 at 23° C. for 30 minutes, 0.55 g/m$^2$ of physical development silver was formed.

Then, in the same manner as in Example 1, Lithographic printing plate precursor 15 was prepared. As a result, a silver amount of the silver thin film was substantially the same as that of Lithographic printing plate precursor 1 of Example 1. Also, in the same manner as in Example 1, a lithographic printing plate was prepared and printing was carried out. As a result, printed materials excellent in printing image quality without stain at a non-image area can be obtained until 10,000 sheets of printing, but exceeding 10,000 sheets of printing, missing of an image at some portions was observed. From the results of Examples 10 and 11, it was found that the processing with a metal salt which is noble than zinc improves printing quality.

Example 12

In the same manner as in Example 1 except for processing with a metal salt processing solution 3 mentioned below at 35° C. for 20 seconds in place of processing with the metal salt solution 1 at 25° C. for 10 seconds, an aluminum base (Aluminum base 16) for offset printing was obtained.

| Metal processing solution 3 | |
|---|---|
| Nickel sulfate | 30 g |
| Copper sulfate | 10 g |
| Zinc white | 30 g |
| Sodium hydroxide | 40 g |
| Sodium cyanide | 15 g |
| Make up to 1 liter with addition of pure water. | |

When the thus prepared Aluminum base 16 was immersed in the above-mentioned physical development solution 1 at 23° C. for 30 minutes, 0.75 g/m$^2$ of physical development silver was formed.

Then, in the same manner as in Example 1, Lithographic printing plate precursor 16 was prepared. As a result, a silver amount of the silver thin film was substantially the same as that of Lithographic printing plate precursor 1 of Example 1. Also, in the same manner as in Example 1, a lithographic printing plate was prepared and printing was carried out. As a result, printed materials excellent in printing image quality without stain at a non-image area can be obtained until 100,000 sheets of printing. It was found that when the aluminum base of the present invention was used, an excellent printing plate could be obtained.

Example 13

A JIS A 1050 type aluminum plate web having a width of 300 mm and a thickness of 0.2 mm was transferred with a processing rate of 1.3 m/min, and immersed in a 4% sodium hydroxide aqueous solution at 50° C. for 30 seconds and then washed with water. Thereafter, it was further immersed in an indirect electric supply system electrolytic cell filled with 1.5% hydrochloric acid at 20° C. and single-phase alternating electric current with 20 A/dm$^2$ and 50 Hz was passed therethrough from a power source for 60 seconds to effect an alternating electric current electrolytic graining treatment, and then washed with water. Then, the material was immersed in a 6% nitric acid aqueous solution at 60° C. for 30 seconds to effect desmutting, washed with water, passed into a 20% sulfuric acid at 25° C. for 60 seconds to effect anodizing treatment with a direct electric current of 4 A/dm$^2$ and washed with water. Next, pore filling treatment was carried out by immersing the material in a neutral electrolyte (pH=7.4) comprising 0.5M of boric acid (H$_3$BO$_3$) and 0.05M of borax (Na$_2$B$_4$O$_7$) for 20 seconds under applying 100 V of voltage and passing a direct current. Thereafter, the material was dried to obtain Aluminum base 17 for offset printing. A thickness of an anodized film of the aluminum base was 0.8 μm and a thickness of a barrier layer at the bottom of micropores was 50 nm.

As a comparative sample, in the same manner as mentioned above except for effecting the pore filling treatment, Aluminum base 18 was obtained. A thickness of an anodized film of the aluminum base was 0.8 μm and a thickness of a barrier layer at the bottom of micropores was 22 nm.

When the thus prepared Aluminum bases 17 and 18 were immersed in the above-mentioned physical development solution 1 at 23° C. for 30 minutes, 0.87 g/m$^2$ and 0.84 g/m$^2$ of physical development silver were formed, respectively.

The thus prepared Lithographic printing plate precursors 17 and 18 were exposed with a YAG laser with a wavelength of 1064 nm at 8 W to expose aluminum base surfaces whereby Lithographic printing plates 17 and 18 were obtained. In Lithographic printing plate 17, a uniform and sharp dot image was obtained, whereas in Lithographic printing plate 18, slight unevenness occurred at a non-image area. The thus prepared lithographic printing plates were mounted on an offset printer (3200MCD, trade name, manufactured by Ryobi Imagics Co.) and when printing was carried out by 200,000 sheets, printed materials excellent in printing image quality without stain at a non-image area could be obtained in Lithographic printing plate 17, but in Lithographic printing plate 18, partial thinning of dot was observed. From this Example, it was found that an excellent printing plate could be obtained when the aluminum base subjected to pore filling treatment was used.

Example 14

Preparation of Lithographic Printing Plate Precursor 19

When Aluminum base 1 of Example 1 was immersed in the following physical development solution 2 at 23° C. for 1 minute and then washed with water for 30 seconds, a silver thin film having a silver amount of 0.61 g/m$^2$ was obtained.

Physical development solution 2:1 part of Solution B was added to 5 parts of Solution A in volume ratio

| Solution A: | Exemplary compound A10 | 135 g |
|---|---|---|
| | Silver nitrate (10% solution) | 75 ml |
| | Make up to 1000 ml with addition of water. | |
| Solution B: | Anhydrous sodium sulfite | 20 g |
| | Hydroquinone | 20 g |
| | Make up to 1000 ml with addition of water. | |

Preparation of Lithographic Printing Plate Precursor 20

In the same manner as in preparation of Lithographic printing plate precursor 19 except for using 120 g of the exemplary compound AP2 in place of the exemplary compound A10 used in preparation of Lithographic printing plate precursor 19, a silver thin film having a silver amount of 1.84 g/m$^2$ was obtained.

The thus prepared Lithographic printing plate precursors 19 and 20 were exposed with a YAG laser with a wavelength of 1064 nm at 8 W to expose aluminum base surfaces whereby Lithographic printing plates 19 and 20 were obtained. The thus prepared lithographic printing plates were mounted on an offset printer (3200MCD, trade name, manufactured by Ryobi Imagics Co.) and printing was carried out by 150,000 sheets. As a result, printed materials excellent in printing image quality without stain at a non-image area could be obtained in both of Lithographic printing plates.

Example 15

In the same manner as in Example 14 except for using A6, A12, AP1 or AP8 in place of the exemplary compound A1 used in Example 14, silver thin films formation, plates making and printing tests were carried out. As a result, printed materials excellent in printing image quality without stain at a non-image area could be obtained by 150,000 sheets of printing.

Example 16

A JIS A 1050 type aluminum plate web having a width of 300 mm and a thickness of 0.2 mm was transferred with a processing rate of 1.3 m/min, and immersed in a 4% sodium hydroxide aqueous solution at 50° C. for 30 seconds and then washed with water. Thereafter, it was further immersed in an indirect electric supply system electrolytic cell filled with 1.5% hydrochloric acid at 20° C. and single-phase alternating electric current with 20 A/dm$^2$ and 50 Hz was passed therethrough from a power source for 60 seconds to effect an alternating electric current electrolytic graining treatment, and then washed with water. Then, the material was immersed in a 6% nitric acid aqueous solution at 60° C. for 30 seconds to effect desmutting, washed with water, passed into a 20% sulfuric acid at 25° C. for 50 seconds to effect anodizing treatment with a direct electric current of 5 A/dm$^2$ and washed with water. Thereafter, the material was dried to obtain an aluminum base (Aluminum base 21) for offset printing.

When the thus prepared Aluminum base 21 was immersed in the following physical development solution 3 at 23° C. for 30 minutes followed by washing with water for 30 seconds, a silver thin film having a silver amount of 0.64 g/m$^2$ was obtained.

On Aluminum base 21 having the above surface activity, a nucleus coating solution (as a hydrophilic polymer, a copolymer of acrylamide and imidazole of No. 3 is contained in the ratio of 4 mg/m$^2$) described in Example 2 of Japanese Provisional Patent Publication No. 21602/1978 was coated and dried to form a physical development nuclei layer.

Preparation of Lithographic Printing Plate Precursor 21

When the thus prepared Aluminum base 21 was immersed in the following physical development solution 3 at 23° C. for 30 minutes followed by washing with water for 30 seconds, a silver thin film having a silver amount of 1.24 g/m$^2$ was obtained.

Physical development solution 3:1 part of Solution B was added to 5 parts of Solution A in volume ratio.

| | | |
|---|---|---|
| Solution A: | Anhydrous sodium sulfite | 165 g |
| | Silver nitrate (10% solution) | 75 ml |
| | Make up to 1000 ml with addition of water. | |
| Solution B: | Anhydrous sodium sulfite | 20 g |
| | Hydroquinone | 20 g |
| | Make up to 1000 ml with addition of water. | |

The thus prepared silver thin film was photographed by using a scanning type electron microscope. As a result, it was found that the silver thin film comprises granular silver particles. When the average particle size thereof was measured, it was 0.2 μm which was close to the upper limit of the present invention.

Preparation of Lithographic Printing Plate Precursor 22

In the same manner as mentioned above, when the thus prepared Aluminum base 21 was immersed in the following physical development solution 4 at 23° C. for 3 minutes followed by washing with water for 30 seconds, a silver thin film having a silver amount of 1.21 g/m$^2$ was obtained.

Physical development solution 4:1 part of Solution B was added to 5 parts of Solution A in volume ratio.

| | | |
|---|---|---|
| Solution A: | Exemplary compound A10 | 135 g |
| | Silver nitrate (10% solution) | 75 ml |
| | Make up to 1000 ml with addition of water. | |
| Solution B: | Anhydrous sodium sulfite | 20 g |
| | Hydroquinone | 20 g |
| | Make up to 1000 ml with addition of water. | |

The thus prepared silver thin film was photographed by using a scanning type electron microscope. As a result, it was found that the silver thin film comprises granular silver particles. When the average particle size thereof was measured, it was within the range of 0.005 to 0.2 μm.

Preparation of Lithographic Printing Plate Precursor 23

In the same manner as mentioned above except for using 110 g of the exemplary compound AP2 in place of the exemplary compound A10 used in preparation of Lithographic printing plate precursor 22, a silver thin film having a silver amount of 1.82 g/m$^2$ was obtained. The thus prepared silver thin film was observed by using a scanning type electron microscope in the same manner as mentioned above, it was found that the silver thin film comprises granular silver particles. When the average particle size thereof was measured, it was within the range of 0.005 to 0.2 μm.

Preparation of Lithographic Printing Plate Precursor 24

In the same manner as mentioned above except for not using the exemplary compound A10 used in preparation of Lithographic printing plate precursor 22, preparation was carried out but no silver film was formed after immersing for 1 minute. When 10 minutes past, a silver thin film having a silver amount of 1.61 g/m$^2$ was obtained. The thus prepared silver thin film was observed by using a scanning type electron microscope in the same manner as mentioned above, it was found that the silver thin film comprises granular silver particles. When the average particle size thereof was measured, it was 0.3 μm or so.

The thus prepared Lithographic printing plate precursors 21, 22, 23 and 24 were exposed by a YAG laser with a wavelength of 1064 nm at 8 W to expose a hydrophilic layer whereby Lithographic printing plates were obtained. Among these plates, as for Lithographic printing plate precursor 24, ablation was possible with a 10-fold later scanning rate as compared with Lithographic printing plate precursors 21, 22 and 23, and sensitivity was markedly low. The thus obtained lithographic printing plates were mounted on an offset printer (3200MCD, trade name, manufactured by Ryobi Imagics Co.), and printing was carried out by 150,000 sheets. As a result, in Lithographic printing plates 22 and 23, printed materials excellent in printing image quality without stain at a non-image area were obtained. In Lithographic printing plate 21, adhesion of ink is slightly poor as compared with Lithographic printing plates 22 and 23, and an amount of print before startup becomes twice, but after good printing material was obtained, printed materials excellent in printing image quality without stain at a non-image area were obtained. In Lithographic printing plate 24, adhesion of ink is worse but when the plate surface was made oleophilic by a liquid containing an oil, printing became possible. When 10,000 sheets were printed, stain was occurred but before generating stain, good printing materials could be obtained.

As explained in detail above, the process for making a lithographic printing plate of the present invention is different from the conventional process for making a lithographic printing plate using a diazo compound or a photopolymer, operation can be carried out under a room light and no developing solution is required so that operation environment is extremely excellent. Also, the method can correspond to a direct imaging method using a laser beam so that it is excellent in printability, and an excellent effect that an image having high resolution can be obtained with a low cost can be established.

What we claimed is:

1. A process for making a lithographic printing plate which comprises subjecting a lithographic printing plate precursor having a silver thin film on a grained and anodized aluminum base to exposure by a heat-mode laser beam whereby removing said silver thin film, wherein said aluminum base has a surface activity which can form physical development silver in an amount of 0.5 g/m$^2$ or more when the base is processed by using the following Physical development solution 1 at 23° C. for 30 minutes:

Physical development solution 1 wherein 1 part by volume of Solution B is added to 5 parts by volume of Solution A;

| Solution A: | Anhydrous sodium sulfite | 180 g |
| --- | --- | --- |
| | 10% Silver nitrate solution | 75 ml |
| | Make up to 1000 ml with addition of water, | |
| Solution B: | Anhydrous sodium sulfite | 20 g |
| | Hydroquinone | 20 g |
| | Make up to 1000 ml with addition of water. | |

2. The process for making a lithographic printing plate according to claim 1, wherein the silver thin film of said lithographic printing plate precursor is formed by using the silver complex diffusion transfer process after providing a physical development nuclei layer on said aluminum base.

3. The process for making a lithographic printing plate according to claim 1, wherein the silver thin film of a lithographic printing plate precursor comprises a physical development silver formed by the silver complex transfer diffusion process.

4. The process for making a lithographic printing plate according to claim 3, wherein the silver thin film of said lithographic printing plate precursor is formed by using the silver complex diffusion transfer process after providing a physical development nuclei layer on said aluminum base.

5. The process for making a lithographic printing plate according to claim 1, wherein the aluminum base has been subjected to graining treatment, followed by treatment with an acidic solution, and then subjected to anodizing treatment.

6. The process for making a lithographic printing plate according to claim 5, wherein the silver thin film of said lithographic printing plate precursor is formed by using the silver complex diffusion transfer process after providing a physical development nuclei layer on said aluminum base.

7. The process for making a lithographic printing plate according to claim 5, wherein the silver thin film of a lithographic printing plate precursor comprises a physical development silver formed by the silver complex transfer diffusion process.

8. The process for making a lithographic printing plate according to claim 7, wherein the silver thin film of said lithographic printing plate precursor is formed by using the silver complex diffusion transfer process after providing a physical development nuclei layer on said aluminum base.

9. The process for making a lithographic printing plate according to claim 5, wherein the acidic solution is a solution containing a nitric acid.

10. The process for making a lithographic printing plate according to claim 9, wherein the silver thin film of said lithographic printing plate precursor is formed by using the silver complex diffusion transfer process after providing a physical development nuclei layer on said aluminum base.

11. The process for making a lithographic printing plate according to claim 9, wherein the silver thin film of a lithographic printing plate precursor comprises a physical development silver formed by the silver complex transfer diffusion process.

12. The process for making a lithographic printing plate according to claim 11, wherein the silver thin film of said lithographic printing plate precursor is formed by using the silver complex diffusion transfer process after providing a physical development nuclei layer on said aluminum base.

13. The process for making a lithographic printing plate according to claim 1, wherein a thickness of the anodized film of said aluminum base is 0.6 μm or more, and said silver thin film comprises a physical development silver formed by the silver complex diffusion transfer process.

14. The process for making a lithographic printing plate according to claim 13, wherein the silver thin film of said lithographic printing plate precursor is formed by using the silver complex diffusion transfer process after providing a physical development nuclei layer on said aluminum base.

15. The process for making a lithographic printing plate according to claim 1, wherein a ratio of an anodized amount AW to the center line surface roughness Ra measured according to JIS B 0601 of said aluminum base (AW/Ra) is 5 or more, and said silver thin film comprises a physical development silver formed by the silver complex diffusion transfer process.

16. The process for making a lithographic printing plate according to claim 15, wherein the silver thin film of said lithographic printing plate precursor is formed by using the silver complex diffusion transfer process after providing a physical development nuclei layer on said aluminum base.

17. In a process for making a lithographic printing plate which comprises subjecting a lithographic printing plate precursor having a silver thin film provided on a grained and anodized aluminum base to laser beam exposure to remove said silver thin film whereby forming a lithographic printing plate, wherein said aluminum base has been subjected to anodizing treatment after treating with an acidic treatment solution, and said silver thin film is formed by coating a solution containing a silver ion on said aluminum base without providing a physical development nuclei layer, to form physical development nuclei, and then, subjecting the physical development nuclei to silver complex diffusion transfer process.

18. The process for making a lithographic printing plate according to claim 1 which comprises subjecting a lithographic printing plate precursor having a silver thin film provided on a grained and anodized aluminum base to exposure by a heat-mode laser beam to remove said silver thin film whereby forming a lithographic printing plate, wherein said aluminum base is treated by a metal salt solution of zinc or a metal more noble in a standard electrode potential than zinc.

19. The process for making a lithographic printing plate according to claim 18, wherein the silver thin film of said lithographic printing plate precursor is formed by using the silver complex diffusion transfer process after providing a physical development nuclei layer on said aluminum base.

20. The process for making a lithographic printing plate according to claim 18, wherein the metal salt treatment is carried out after a desmutting treatment and before the anodizing treatment.

21. The process for making a lithographic printing plate according to claim 20, wherein the silver thin film of said lithographic printing plate precursor is formed by using the silver complex diffusion transfer process after providing a physical development nuclei layer on said aluminum base.

22. The process for making a lithographic printing plate according to claim 1 which comprises subjecting a lithographic printing plate precursor having a silver thin film provided on a grained and anodized aluminum base to exposure by a heat-mode laser beam to remove said silver thin film whereby forming a lithographic printing plate, wherein said aluminum base is subjected to a pore filling treatment after anodization.

23. The process for making a lithographic printing plate according to claim 22, wherein the silver thin film of said lithographic printing plate precursor is formed by using the silver complex diffusion transfer process after providing a physical development nuclei layer on said aluminum base.

24. The process for making a lithographic printing plate according to claim 1 which comprises subjecting a lithographic printing plate precursor, in which a silver thin film is formed on a support in the presence of an amine compound, to exposure by a heat-mode laser beam whereby the silver film is removed.

25. The process for making a lithographic printing plate according to claim 24, wherein the amine compound is represented by the formula (I):

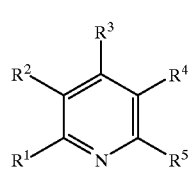

(I)

wherein at least one of $R^1$, $R^2$, $R^3$, $R^4$ and $R^5$ represents a substituted or unsubstituted amino group; and the remaining substituents each represent a hydrogen atom, a halogen atom, a substituted or unsubstituted saturated or unsaturated alkyl group, cycloalkyl group, alkoxy group, aryl group, alkanoyl group, aroyl group or heterocyclic group, or adjacent two of these substituents may form a ring.

26. The process for making a lithographic printing plate according to claim 25, wherein the support is an aluminum base which had been subjected to an acidic processing solution treatment and thereafter subjected to anodizing treatment.

27. The process for making a lithographic printing plate according to claim 1 which comprises subjecting a lithographic printing plate, in which a silver thin film comprising granular silver particles having an average particle size of 0.005 to 0.2 µm is formed on the aluminum base, to exposure by a heat-mode laser beam whereby the silver thin film is removed.

28. The process for making a lithographic printing plate according to claim 24, wherein the support is an aluminum base which had been subjected to an acidic processing solution treatment and thereafter subjected to anodizing treatment.

29. The process for making a lithographic printing plate according to claim 27, wherein the granular silver particles are prepared in the presence of a solvent of silver halide.

30. The process for making a lithographic printing plate according to claim 29, wherein the support is an aluminum base which had been subjected to an acidic processing solution treatment and thereafter subjected to anodizing treatment.

31. The process for making a lithographic printing plate according to claim 29, wherein preparing the solvent is an amine compound.

32. The process for making a lithographic printing plate according to claim 31, wherein the support is an aluminum base which had been subjected to an acidic processing solution treatment and thereafter subjected to anodizing treatment.

33. The process for making a lithographic printing plate according to claim 31, wherein the amine compound is represented by the formula (I):

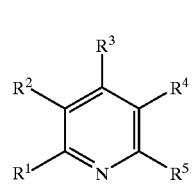

(I)

wherein at least one of $R^1$, $R^2$, $R^3$, $R^4$ and $R^5$ represents a substituted or unsubstituted amino group; and the remaining substituents each represent a hydrogen atom, a halogen atom, a substituted or unsubstituted saturated or unsaturated alkyl group, cycloalkyl group, alkoxy group, aryl group, alkanoyl group, aroyl group or heterocyclic group, or adjacent two of these substituents may form a ring.

34. The process for making a lithographic printing plate according to claim 33, wherein the support is an aluminum base which had been subjected to an acidic processing solution treatment and thereafter subjected to anodizing treatment.

* * * * *